United States Patent
Choi et al.

(10) Patent No.: US 11,972,946 B2
(45) Date of Patent: Apr. 30, 2024

(54) METHOD FOR REMOVING IMPURITIES IN THIN FILM AND SUBSTRATE PROCESSING APPARATUS

(71) Applicant: EUGENE TECHNOLOGY CO., LTD., Yongin-Si (KR)

(72) Inventors: Kyu Jin Choi, Seongnam-si (KR); Gyu Ho Choi, Yongin-si (KR); Sang Hyuk Hwang, Seoul (KR)

(73) Assignee: EUGENE TECHNOLOGY CO., LTD. (KR)

( * ) Notice: Subject to any disclaimer, the term of this patent is extended or adjusted under 35 U.S.C. 154(b) by 0 days.

(21) Appl. No.: 17/574,531

(22) Filed: Jan. 12, 2022

(65) Prior Publication Data
US 2022/0230875 A1  Jul. 21, 2022

(30) Foreign Application Priority Data
Jan. 18, 2021  (KR) .................. 10-2021-0006670

(51) Int. Cl.
*H01L 21/02* (2006.01)
*C23C 16/56* (2006.01)

(52) U.S. Cl.
CPC ........ *H01L 21/02334* (2013.01); *C23C 16/56* (2013.01)

(58) Field of Classification Search
None
See application file for complete search history.

(56) References Cited

U.S. PATENT DOCUMENTS

| 2005/0003089 | A1* | 1/2005 | Won | C23C 16/26 427/249.1 |
| 2012/0112198 | A1* | 5/2012 | Chu | H01L 21/02661 257/77 |

FOREIGN PATENT DOCUMENTS

| JP | H10294018 A | 11/1998 |
| JP | 2001152339 A | 6/2001 |
| JP | 2003347297 A | 12/2003 |
| JP | 2004288884 A | 10/2004 |
| JP | 2005032908 A | 2/2005 |
| JP | 2006279019 A | 10/2006 |
| JP | 2007194582 A | 8/2007 |
| JP | 2010080737 A | 4/2010 |

(Continued)

OTHER PUBLICATIONS

Machine Translation of KR 2005-0113423 A (Year: 2005).*

*Primary Examiner* — Binh X Tran
*Assistant Examiner* — Bradford M Gates
(74) *Attorney, Agent, or Firm* — Renaissance IP Law Group LLP

(57) ABSTRACT

The present inventive concept relates to a method for removing impurities in thin film and a substrate processing apparatus. The method for removing impurities in a thin film includes the steps of: providing a substrate having a thin film formed thereon in a process chamber; supplying a first gas reacting and coupling with impurities contained in the thin film, into the process chamber; exhausting a coupled product of the impurities and the first gas by depressurizing an interior of the process chamber after stopping the supply of the first gas; curing the thin film by supplying a second gas being different from the first gas into the process chamber; and stopping the supply of the second gas and exhausting the remaining second gas from the interior of the process chamber.

7 Claims, 3 Drawing Sheets

(56) References Cited

FOREIGN PATENT DOCUMENTS

| | | |
|---|---|---|
| KR | 19990059064 A | 7/1999 |
| KR | 100333158 B1 | 4/2002 |
| KR | 20050113423 A | 12/2005 |
| TW | 201030792 A | 8/2010 |
| WO | 2011074604 A1 | 6/2011 |
| WO | 2012165263 A1 | 12/2012 |
| WO | 2020076502 A1 | 4/2020 |

* cited by examiner

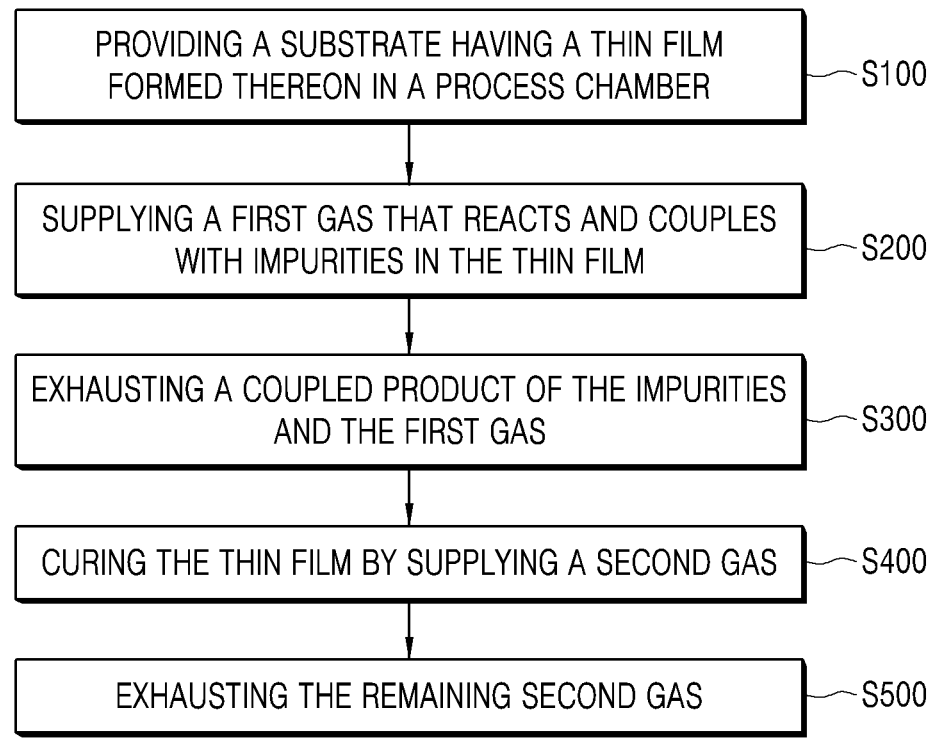
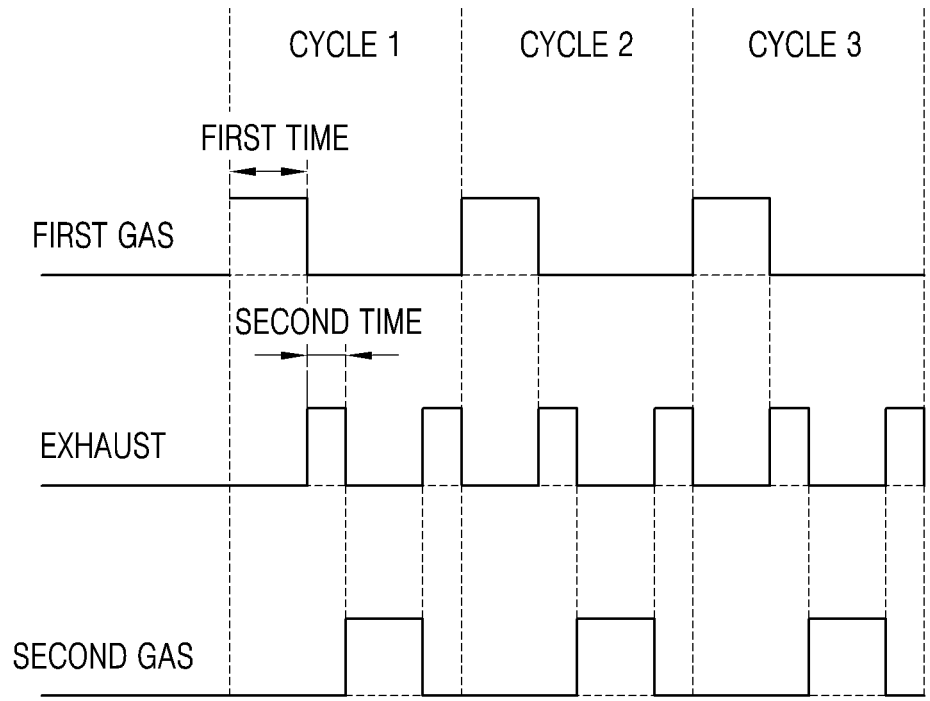

METHOD FOR REMOVING IMPURITIES IN THIN FILM AND SUBSTRATE PROCESSING APPARATUS

CROSS-REFERENCE TO RELATED APPLICATION

This application claims priority to Korean Patent Application No. 10-2021-0006670 filed on Jan. 18, 2021 and all the benefits accruing therefrom under 35 U.S.C. § 119, the contents of which are incorporated by reference in their entirety.

TECHNICAL FIELD

The present disclosure relates to a method for removing impurities in a thin film and a substrate processing apparatus, and more particularly, to a method for removing impurities in a thin film and a substrate processing apparatus, which remove impurities from the thin film.

BACKGROUND

During the semiconductor manufacturing process, a thin film is deposited using methods such as an atomic layer deposition (ALD) and a chemical vapor deposition (CVD) and is used as a semiconductor device. Here, a metallic precursor compound including a metal element and a ligand (or binding element) is mainly used as a source gas for thin film deposition.

In general, when a thin film is deposited using a metal precursor compound, a bonding between a metal element and a ligand is not effectively broken, so the metal element (or an oxide or nitride of the metal element) with a portion of the ligand is deposited. As a result, the ligand may act as an impurity within the thin film, which causes a problem of increasing the resistivity (or permittivity) of the thin film.

Recently, as high performance and high integration of semiconductor devices are required and device sizes are miniaturized, there is a need for a technology to improve the resistivity (or permittivity) characteristics of a thin film used as a semiconductor device and thus a method for effectively removing impurities from a thin film.

SUMMARY

Problems to be Solved

The present inventive concept is to provide a method for removing impurities in a thin film and a substrate processing apparatus, to effectively remove impurities contained in the thin film by sequentially performing a plurality of gas supplies and reduced pressure exhaust.

Means to Solve the Problems

According to an embodiment, a method for removing impurities in a thin film includes steps of: providing a substrate having a thin film formed thereon in a process chamber; supplying a first gas reacting and coupling with impurities contained in the thin film, into the process chamber; exhausting a coupled product of the impurities and the first gas by depressurizing an interior of the process chamber after stopping the supply of the first gas; curing the thin film by supplying a second gas being different from the first gas into the process chamber; and stopping the supply of the second gas and exhausting the remaining second gas from the interior of the process chamber.

The step of supplying the first gas may be performed under a first pressure of 0.1~20 torr inside the process chamber, and the step of exhausting the coupled product may be performed under a second pressure of 0.1~20 mtorr, lower than the first pressure, by depressurizing the interior of the process chamber.

The impurities may include carbon (C), and the first gas may include hydrogen (H).

The thin film may include a metal element, and the second gas may include oxygen (O).

The step of supplying the first gas may be performed for a first time period, and the step of exhausting the coupled product may be performed for a second time period shorter than the first time period.

The step of supplying the first gas may be performed at a temperature of 100 to 400° C.

The step of curing the thin film may include reacting elements in the second gas with a surface of the thin film to form a curing layer.

The curing layer may have a thickness of 500 Å or less.

The steps of supplying the first gas, exhausting the coupled product, curing the thin film, and exhausting the remaining second gas may be repeated a plurality of times.

According to another embodiment, a substrate processing apparatus includes a process chamber in which a substrate having a thin film formed thereon is loaded and unloaded; a first gas supply unit configured to supply a first gas into the process chamber, the first gas reacting and coupling with impurities contained in the thin film; a second gas supply unit configured to supply a second gas into the process chamber, the second gas being different from the first gas; a heater unit disposed outside the process chamber to provide thermal energy to an interior of the process chamber; an exhaust unit configured to exhaust the interior of the process chamber; and a control unit configured to control the first gas supply unit, the second gas supply unit and the exhaust unit, the first gas supply unit may supply the first gas to produce a coupled product by a reaction of the impurities and the first gas, by a control of the control unit, the exhaust unit may exhaust the coupled product, by the control of the control unit, and the second gas supply unit may supply the second gas to cure the thin film, by the control of the control unit.

The control unit may adjust an internal pressure of the process chamber at a first pressure of 0.1~20 torr to supply the first gas, and depressurize the interior of the process chamber to a second pressure of 0.1~20 mtorr, lower than the first pressure, to exhaust the coupled product.

The control unit may further control the heater unit to adjust a temperature inside the process chamber to a temperature of 100 to 400° C.

The control unit may control to repeatedly perform a plurality of times the supply of the first gas, the exhaust of the coupled product, and the supply of the second gas.

The impurities may include carbon (C), and the first gas may include hydrogen (H).

The thin film may include a metal element, and the second gas may include oxygen (O).

Effect

According to the present inventive concept, a method for removing impurities in a thin film can effectively remove impurities from a thin film by reacting impurities contained in the thin film with a first gas to produce a coupled product of the impurities and the first gas and rapidly depressurizing the interior of a process chamber to exhaust the coupled product, and consequently the thin film characteristics such as resistivity can be improved. Moreover, by exhausting a coupled product under rapid reduced pressure from a first pressure of 0.1~20 torr to a second pressure of 0.1~20 mtorr, when a thin film has a trench with a large (or deep) aspect ratio due to a pattern, it is possible to effectively remove impurities from a surface of the thin film even deep in the trench at a low temperature of 400° C. or less.

In addition, when a defect such as a vacancy is generated in a portion (or site) where an impurity has escaped from a thin film, a second gas different from the first gas may be supplied and the defect may be removed by the elements of the second gas to cure the thin film, thereby improving the reliability of the thin film (or semiconductor device).

Furthermore, by repeating a plurality of times the supply and exhaust of the first gas and the supply and exhaust of the second gas, the removal rate of impurities can be maximized.

Additionally, by forming a curing layer on a surface of the thin film by the second gas, the curing layer can suppress or prevent any reaction between the first gas with elements other than impurities in the thin film. Moreover, the curing layer formed on the thin film surface can prevent foreign substances from adhering to the thin film on a substrate unloaded from a process chamber, or the thin film from being oxidized.

BRIEF DESCRIPTION OF DRAWINGS

FIG. 1 is a flowchart showing a method for removing impurities in a thin film according to an embodiment of the present inventive concept.

FIG. 2 is a graph for explaining a cycle of supply and exhaust of the first gas and the second gas according to an embodiment of the present inventive concept.

DETAILED DESCRIPTION

Figure 3:
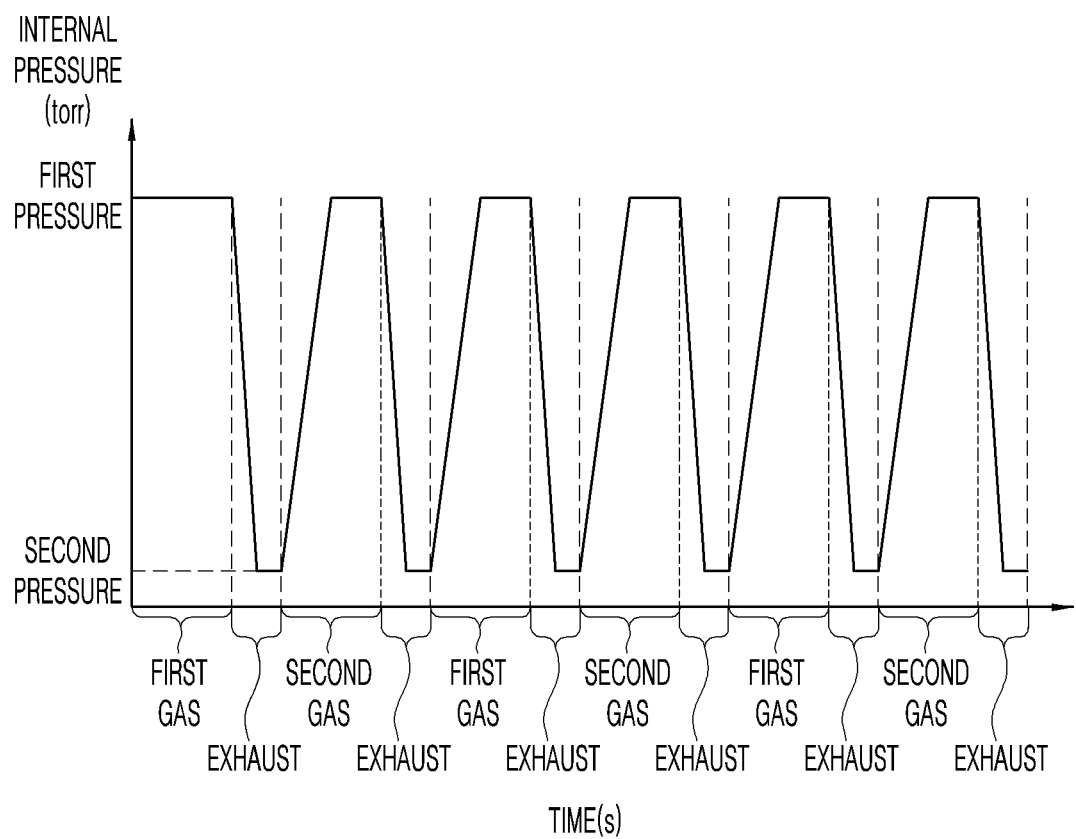
FIG. 3 is a graph for explaining a change in the internal pressure of the process chamber in each of steps according to an embodiment of the present inventive concept.

Hereinafter, with reference to the accompanying drawings, the embodiments of the present inventive concept will be described in detail. However, the present inventive concept is not limited to these embodiments disclosed below and will be implemented in various forms. Only the embodiments of the present inventive concept are provided to complete the disclosure of the present inventive concept, and to completely inform those of ordinary skill in the art the scope of the invention. Throughout the description, the same reference numerals are assigned to the same elements, the drawings may be partially exaggerated in size to accurately describe the embodiments of the present inventive concept, and the same reference numerals in the drawings refer to the same elements.

FIG. 1 is a flowchart showing a method for removing impurities in a thin film according to an embodiment of the present inventive concept.

With reference to FIG. 1, according to an embodiment, a method for removing impurities in a thin film includes the step of: providing a substrate having a thin film formed thereon in a process chamber (S100); supplying a first gas reacting and coupling with impurities contained in the thin film, into the process chamber, the first gas (S200); exhausting a coupled product of the impurities and the first gas by depressurizing an interior of the process chamber after stopping the supply of the first gas (S300); curing the thin film by supplying a second gas being different from the first gas into the process chamber (S400); and stopping the supply of the second gas and exhausting the remaining second gas from the interior of the process chamber (S500).

First, a substrate having a thin film formed thereon is provided inside the process chamber (S100). The thin film may contain impurities, and the substrate having the thin film formed thereon may be loaded (or provided) inside the process chamber to remove these impurities. For example, the substrate may be loaded into the process chamber by a transfer robot. The substrate may be a wafer, and the thin film may be an insulating film (or dielectric film) such as oxide or nitride or a metal film. For example, the thin film may be deposited using a metallic precursor compound; a metal oxide film or a metal nitride film may be formed by oxidation or nitration of a metal, or a metal film may be formed by deposition of a metal itself.

Also, the thin film may have a pattern. For example, as a semiconductor device is highly integrated, the thin film may be miniaturized and have a pattern having various structures. The pattern may have a relatively thin thickness and/or a narrow width, or may have a complex shape. A trench may be formed between patterns. The trench may have a large aspect ratio, and may be deep and become narrower downward.

The process chamber may be a single wafer type that processes the substrate one by one, or a batch type that simultaneously processes a plurality of substrates by loading them in multiple layers on a substrate boat.

When the process chamber is a batch type, the step of providing the substrate inside the process chamber (S100) may include the steps of loading the substrate on a substrate boat in multiple layers (S110); and providing the substrate boat inside the process chamber (S120).

The substrate may be loaded in multiple layers on a substrate boat (S110). The substrate boat may have multi-layered slots formed in a plurality of rods so that the substrates can be inserted and loaded therein. Also, the substrate boat may have multi-layered isolation plates coupled to the plurality of rods. These isolation plates may be disposed above or below the substrates so that each substrate can have an individual processing space. The substrate boat may be rotated during the process. As a material for the substrate boat such as the rod and the isolation plate, ceramic, quartz, synthetic quartz, etc. may be used; the substrate boat is not limited thereto, but may take various structures, shapes, and materials.

For example, the process chamber may be a process tube (or reaction tube) receiving the substrate boat, and a loading chamber may be provided in communication with the process chamber under the process chamber. The substrate may be loaded on the substrate boat in multiple layers from the loading chamber by a transfer robot, etc. The process tube may have a single tube or a plurality of tubes as long as it can provide an internal space (process space) in which the substrate boat can be received. The process tube may be composed of an outer tube and an inner tube, and a flange part may be coupled to a lower portion of the inner tube to support it; the inner tube is not limited thereto, but may take various structures and shapes.

The substrate boat may be provided inside the process chamber (S120). To perform an impurity removing process on the thin film formed on the substrate, the substrate boat on which the substrates are loaded may be provided inside the process chamber. For example, when the substrates are loaded on the substrate boat, the substrate boat on which the substrates are loaded may be lifted by a boat elevator to be loaded (or provided) into the interior (space) of the process chamber. The boat elevator may be provided with a seal cap including an O-ring, and the O-ring may be attached to the flange part to seal a lower end of the flange part. Once the substrate boat is received inside the process chamber, an impurity removing process may be performed on the thin film formed on the substrate.

Such batch type procedure using the substrate boat can simultaneously process a plurality of substrates, thereby increasing the throughput of substrates per time.

Next, a first gas reacting and coupling with impurities contained in the thin film is supplied into the process chamber (S200). The first gas may be reacted and coupled with impurities contained in the thin film to produce a coupled product. As such, by supplying the first gas into the process chamber and reacting it with impurities in the thin film (e.g., impurities on a surface of the thin film), the first gas-coupled product may be generated, and impurities may be removed (detached) from the thin film.

For example, the impurities may include carbon, and the first gas may include hydrogen (H). When the thin film is deposited using a metal precursor compound such as an organometallic compound, the bonding between metal element and carbon ligand is not effectively broken, so that the metal element or oxides or nitrides of the metal element can be deposited with the bound some carbon atoms (C). As a result, carbon is contained in the thin film and act as an impurity, which may increase the resistivity and/or dielectric constant of the thin film. On the other hand, in some cases, a thin film having a high dielectric constant may be required. In this case, there may be a problem in that the dielectric constant of thin film is lowered due to impurities. Accordingly, the impurity carbon must be removed from the thin film. The impurity (carbon) can be removed from the thin film by reacting carbon with the first gas containing hydrogen.

A hydrogen atom (H) may react and bind with a carbon atom (C), and a binding product of CxHy-based hydrocarbon (such as $CH_2$, $CH_4$, etc.) may be generated by such C—H bond. As the binding product CxHy-based hydrocarbon is in a gaseous phase, it may be discharged from the process chamber through purge and/or exhaust. The gas containing hydrogen atoms (H) may be a hydrogen gas ($H_2$) but is not limited thereto. The gas may be any gas which may react with carbon atoms (C) and provide hydrogen atoms (H) without causing reactions other than the binding reaction between hydrogen atoms (H) and carbon atoms (C).

As the next stage, the supply of the first gas is stopped, and a coupled product of the impurities and the first gas is exhausted by depressurizing an interior of the process chamber (S300). By depressurizing the interior of the process chamber, the coupled product of the impurities and the first gas may be exhausted. Here, the coupled product of the impurities and the first gas may be in a gaseous phase, and thus it may be exhausted (discharged) from the process chamber through purge and/or exhaust. When the coupled product is piled up (or crowded) around the thin film (e.g., on a surface of the thin film), the first gas and/or the second gas do not reach the surface (or exposed surface) of the thin film and thus cannot react with the impurities and/or the thin film. Consequently, it may no longer be possible to remove the impurities or cure the thin film.

Accordingly, by depressurizing the interior of the process chamber to exhaust the coupled product, it can be ensured that the second gas may react with the thin film or the first gas may react with the impurities in a subsequent process. As a result, the impurities can be effectively removed, and the thin film can be cured.

Next, the thin film is cured by supplying a second gas being different from the first gas into the process chamber (S400). A defect such as a vacancy may be generated in a portion (or site) where the impurity has escaped from the thin film. To improve the quality of the thin film, the second gas different from the first gas may be supplied to cure the thin film. For example, the vacancy is filled (substituted) with the elements of the second gas to remove the defect, thereby improving the quality and reliability of the thin film (or semiconductor device).

The thin film may contain a metal element (M). The metal element (M) may include any transition metal such as zinc (Zn), titanium (Ti), tantalum (Ta), chromium (Cr), zirconium (Zr), tungsten (W), nickel (Ni) and copper (Cu), but is not limited thereto. The metal element (M) may be any metal element capable of being deposited as a thin film such as a metal film, a metal oxide film, or a metal nitride film.

When the impurity is coupled with the element of the first gas, the bond between metal element (M) and impurity is separated, and the metal element (M) will have a dangling bond (non-bonding site). For example, when the impurity is a carbon atom (C) and the first gas is a hydrogen gas ($H_2$), a M-C bond is separated by binding the hydrogen atom (H) and/or hydrogen molecule ($H_2$) to the carbon atom (C), and the metal element (M) has the dangling bond, thereby creating an unnecessary adsorption site on the thin film. A foreign substance or impurity may be adsorbed or re-adsorbed at the unnecessary adsorption site.

This problem can be solved by curing the thin film. The unnecessary adsorption site may be removed by binding the element of the second gas to the dangling bond of the metal element (M), and the vacancy may be filled with the element of the second gas to remove the defect.

The step of curing the thin film (S400) may include reacting elements in the second gas with a surface of the thin film to form a curing layer (S410).

The elements of the second gas may react with the surface of the thin film to form a curing layer (S410). The elements of the second gas may react with the surface of the thin film to be adsorbed to the surface (i.e., the unnecessary adsorption site) of the thin film to form the curing layer. By removing the dangling bond from the metal element (M), it is possible to prevent the creation (or generation) of the unnecessary adsorption site. In this case, the elements of the second gas may at least partially oxidize or nitride the surface of the thin film, and thus the curing layer may be an oxidation (oxide) layer or a nitration (nitride) layer.

For example, the second gas may include oxygen (O), and an oxygen atom (O) is bonded to the dangling bond of the metal element (M) to be adsorbed to the surface of the thin film to form the curing layer. The oxygen may at least partially oxidize the surface of the thin film to form an oxidation layer, and thus the curing layer may be an oxide layer of the metal element (M). For example, the second gas may be a gas containing oxygen atoms (O) or an oxygen gas ($O_2$) but is not limited thereto. The gas may be any gas which may provide oxygen atoms (O) capable of being bonded to the dangling bond of the metal element (M).

The curing layer can fill portions where the impurities have escaped from the thin film to remove defects, as well as remove unnecessary adsorption sites to prevent foreign substances or impurities from adsorbing or re-adsorbing on the surface of the thin film. As a result, the thin film is passivated, thereby stabilizing the thin film and improving the reliability of the thin film.

The curing layer may have a thickness of 500 Å or less, such as a thickness in the range of 0.1 to 500 Å (i.e., 0.01 to 50 nm), 3 to 100 Å, and 3 to 8 Å (e.g., about 5 Å or less). That is, the curing layer may have a thickness of less than one atomic layer to several atomic layers and may be a discontinuous layer or a continuous layer. Here, the curing layer having a thickness of less than 1 atomic layer may be a curing layer formed discontinuously, and the curing layer having a thickness of 1 atomic layer or more may be a curing layer formed continuously.

If the curing layer becomes thinner than 0.1 Å, the portions where the impurities have escaped from the thin film cannot be sufficiently filled, and thus it is difficult to effectively remove defects. Also, the dangling bonds of the metal element (M) and hence unnecessary adsorption sites cannot be sufficiently removed. On the other hand, if the curing layer exceeds 500 Å, the elements of the second gas such as oxygen (O) become excessive throughout the thin film and the curing layer, the electrical characteristics (e.g., resistivity, electrical conductivity, etc.) of the thin film may be deteriorated.

For example, the thin film may be a zinc oxide (ZnO) film containing carbon (C) as an impurity. When the hydrogen atom (H) of the first gas binds to the impurity carbon atom (C), a Zn—C bond is separated, thereby creating a dangling bond of zinc (Zn). Then, the oxygen atom (O) of the second gas is bonded (or adsorbed) to the dangling bond of zinc (Zn) to form a zinc oxide (layer). In this case, since the zinc oxide (layer) is homogenous with the zinc oxide (ZnO) film, the characteristics of the thin film are not deteriorated, as well as the dangling bonds of zinc (Zn) are all filled, and oxygen (O) deficiency is prevented, so that the characteristics and/or quality of the thin film can be improved.

On the other hand, when the thin film is a metal nitride film, the second gas containing nitrogen (N) is used, and thus, instead of the oxygen atom (O), the nitrogen atom (N) is bonded to the dangling bond of the metal element (M) created by the separation of the M-C bond, thereby forming a metal nitride (layer). Even in the case that the thin film is a metal film, the oxygen gas ($O_2$) may be used as the second gas, and the curing layer will be very thin as much as 0.1 to 500 Å. It not only has little effect the characteristics of the thin film, such as electrical characteristics, but it can also fill in the portions where the impurities have escaped from the thin film to remove defects. As a result, the thin film is passivated, thereby stabilizing the thin film and improving the reliability of the thin film.

In addition, the curing layer may passivate (the surface of) the thin film to prevent foreign substances from adhering to the thin film on the substrate discharged from the process chamber or the thin film from being oxidized.

Next, the supply of the second gas is stopped and the remaining second gas is exhausted from the interior of the process chamber (S500). If the second gas remains (or stays) inside the process chamber, the elements of the second gas may continuously react on the surface of the thin film, so that the elements of the second gas such as oxygen (O) can become excessive in the thin film, and the curing layer may have a thickness as much as 500 Å or more. However, the above-mentioned problem may be solved by stopping the supply of the second gas and exhausting the remaining second gas from the interior of the process chamber to remove the second gas from the interior of the process chamber. Also, by exhausting the remaining second gas from the interior of the process chamber to remove the second gas, when the step of supplying the first gas (S200) is performed again afterward, it is possible to prevent the second gas from reacting with the first gas. Moreover, the second gas is prevented from accumulating around the thin film, so that the first gas can better reach the surface of the thin film as well as react effectively with impurities.

FIG. 2 is a graph for explaining a cycle of supply and exhaust of the first gas and the second gas according to an embodiment of the present inventive concept, and FIG. 3 is a graph for explaining a change in the internal pressure of the process chamber in each of steps according to an embodiment of the present inventive concept.

With reference to FIGS. 2 and 3, the interior of the process chamber in the step of supplying the first gas (S200) is under a first pressure of 0.1 to 20 torr, and the interior of the process chamber in the step of exhausting a coupled product (S300) is depressurized to a second pressure of 0.1 to 20 mtorr, lower than the first pressure. The second pressure may be significantly lower than the first pressure as much as about $\frac{1}{1,000}$ of the first pressure. That is, in the step of exhausting the coupled product (S300), the internal pressure of the process chamber is reduced to about $\frac{1}{1,000}$ of the pressure in the step of supplying the first gas (S200), and it may be significantly lower than the pressure in the process of supplying the first gas (S200). Thus, the coupled product can be effectively exhausted from the interior of the process chamber, the impurities can be effectively removed from the thin film, and consequently the characteristics of the thin film such as resistivity can be improved.

If the first pressure is less than 0.1 torr, the first gas may not sufficiently react with the impurities, or the elements of the first gas may not have sufficient energy to be coupled with the impurities, and the difference from the second pressure may be reduced, so that it is difficult to effectively exhaust the coupled product from the interior of the process chamber. To the contrary, if the first pressure is greater than 20 torr, an airflow (or air pressure) may be formed into the thin film from the outside, so that it is difficult to detach the impurities from the surface of the thin film (discharge them to the outside from the thin film), and the impurities may not easily migrate from the interior of the thin film to the surface thereof.

If the second pressure is less than 0.1 mtorr, an excessive force (or pressure or air pressure) may be applied to the process chamber, and it may take a long time to return to the first pressure. To the contrary, if the second pressure is greater than 20 mtorr, the difference from the first pressure may be reduced, so that it is difficult to effectively exhaust the coupled product from the interior of the process chamber.

As an example, although the first pressure is limited in the range of 0.1 to 20 torr and the second pressure is limited in the range of 0.1 to 20 mtorr, it can be seen that the difference between the first pressure and the second pressure is about 1,000 times as large as the pressure difference within the ranges of the first pressure and the second pressure. That is, the pressure difference is about 1000 times, which is sufficient to allow the coupled product to be effectively exhausted.

The step of curing the thin film (S400) may be performed under the first pressure, and the step of exhausting the remaining second gas (S500) may be performed under the second pressure, but is not particularly limited thereto.

The step of supplying the first gas (S200) may be performed for a first time (period), and the step of exhausting the coupled product (S300) may be performed for a second time (period) shorter than the first time. That is, the internal pressure of the process chamber may be rapidly reduced from the (first) pressure in the step of supplying the first gas (S200) to the pressure in the step of exhausting the coupled product (S300). In this case, the internal pressure of the process chamber may be rapidly reduced to about 1/1,000 of the pressure in the step of supplying the first gas (S200). Thus, the coupled product may be better exhausted from the interior of the process chamber. Here, the first time may be 4 to 20 seconds (s) and the second time may be 2 to 10 seconds (s). The second time period may be about half of the first time period, but is not limited thereto; it is sufficient if the second time period is shorter than the first time period.

When a pattern is formed in the thin film to make a trench with a large aspect ratio in the thin film, it is difficult to remove impurities from the surface (or exposed surface) of the thin film deep in the trench. However, according to the present inventive concept, the coupled product may be exhausted by rapidly reducing the internal pressure of the process chamber from the first pressure of 0.1 to 20 torr to the second pressure of 0.1 to 20 mtorr, and the impurities may be effectively removed from the surface of the thin film even deep in the trench.

The step of curing the thin film (S400) may be performed for said first time, and the step of exhausting the remaining second gas (S500) may be performed for said second time, but is not particularly limited thereto.

Conventionally, a thin film has been treated with heat at a temperature higher than 400° C. to transfer energy to an impurity for detachment (discharge) from a surface of the thin film and remove the impurity from the thin film. In this case, a thermal load or a thermal history applied to the substrate and/or the thin film may be a problem. In particular, as a semiconductor device is recently highly integrated, the semiconductor manufacturing process requires a more limited thermal history, and the process of removing impurities is also required to be performed at a low temperature of 400° C. or less. Therefore, the conventional method of removing impurities through high-temperature heat treatment has a limitation in its use. To solve this problem, an attempt was made to heat treatment at a high pressure of 2 atm or more (or 202,650 Pa or more) so that the heat treatment temperature could be lowered, but this method has a problem such as an increased risk of gas leakage due to high pressure, and thus a separate component device is required.

According to the present inventive concept, the process of removing impurities can be performed at a low pressure of 20 torr or less and a low temperature of 400° C. or less, and thus a problem such as thermal load or thermal history and the risk of gas leakage due to high pressure as well as the need for a separate device may be solved. Thus, the impurities may be effectively removed from the thin film even at a low pressure of 20 torr or less and a low temperature of 400° C. or less, and even in the case that the thin film has a trench with a large aspect ratio due to a pattern, the impurities may be effectively removed from the surface of the thin film even deep in the trench.

For example, the step of removing impurities may be performed at a (process) temperature of 100 to 400° C., and at least the step of supplying the first gas (S200) may be performed at a temperature of 100 to 400° C. Here, the temperature of 100 to 400° C. may be a temperature inside the process chamber or a temperature of the substrate. If the temperature in the step of supplying the first gas (S200) is lower than 100° C., the energy for detachment of impurities from the surface of the thin film is not sufficiently transferred to the impurities, so that it is difficult to effectively remove the impurities. To the contrary, if the temperature in the step of supplying the first gas (S200) is higher than 400° C., the thermal load and/or thermal history applied to the substrate and/or the thin film may become a problem.

To transfer sufficient energy to the impurities to discharge them from the thin film to the outside (or detachment of the impurities from the surface of the thin film), the step of supplying the first gas (S200) may be performed at a temperature of 100° C. or higher. In this case, using sufficient energy, the impurities may be easily discharged from the thin film to the outside, and may be coupled to the elements of the first gas (or coupled with the elements of the first gas and easily detached from the surface of the thin film), so that the impurities can be more effectively removed. Also, when the step of supplying the first gas (S200) is performed at a temperature of 100° C. or higher, the first gas is activated and the elements of the first gas are effectively coupled to the impurities, so that the impurities can be more effectively removed.

The impurities may be effectively removed from the surface of the thin film even at less than 100° C., but the impurities may remain in the thin film. Therefore, by providing energy for the impurities to migrate from the thin film to the surface of the thin film through a temperature of 100° C. or higher (i.e., thermal energy), the impurities may be effectively (or completely) removed in the thin film. Even when the thin film has a trench having a large aspect ratio, the impurities may be more effectively removed even deep in the trench at a temperature of 100° C. or higher.

In addition to the step of supplying the first gas (S200), the steps of exhausting the coupled product (S300), curing the thin film (S400), and exhausting the remaining second gas (S500) may be also performed at a temperature of 100 to 400° C. If the step of curing the thin film (S400) is performed at a temperature of 400° C. or higher, the elements of the second gas such as oxygen (O) can become excessive in the thin film, and the curing layer may have a thickness as much as 500 Å or more.

The steps of supplying the first gas (S200), exhausting the coupled product (S300), curing the thin film (S400), and exhausting the remaining second gas (S500) may be repeated a plurality of times. Here, the steps of supplying the first gas (S200), exhausting the coupled product (S300), curing the thin film (S400), and exhausting the remaining second gas (S500) may be sequentially repeated, otherwise the steps of supplying the first gas (S200) and exhausting the coupled product (S300) may be repeated, and subsequently the steps of curing the thin film (S400) and exhausting the remaining second gas (S500) may be repeated. It is not particularly limited as long as each of the steps of supplying the first gas (S200), exhausting the coupled product (S300), curing the thin film (S400), and exhausting the remaining second gas (S500) are performed a plurality of times.

By repeating the steps of supplying the first gas (S200), exhausting the coupled product (S300), curing the thin film (S400), and exhausting the remaining second gas (S500), the supply and exhaust of the first and second gases may be repeated a plurality of times, thereby maximizing the efficiency of removing the impurities.

When the thin film has a trench with a large aspect ratio, at a lapsed time after the first gas is supplied, the trench is filled with the coupled product, and the first gas may no longer enter (or blocked). Thus, the impurities may not be well removed from an inner wall of the trench (i.e., the thin film's surface within the trench), and some impurities may remain on the inner wall of the trench. By repeating at least the steps of supplying the first gas (S200) and exhausting the coupled product (S300) a plurality of times, the coupled product filled in the trench may be removed and the first gas may be introduced into the trench. As a result, the impurities can be better removed from the inner wall of the trench even deep in the trench, and they can be prevented from remaining on the inner wall of the trench. The internal pressure of the process chamber in the step of exhausting the coupled product (S300) may be rapidly reduced to about $\frac{1}{1,000}$ of the pressure in the step of supplying the first gas (S200). This allows for more effective removal of the coupled product within the trench.

On the order hand, when the steps of supplying the first gas (S200), exhausting the coupled product (S300), curing the thin film (S400), and exhausting the remaining second gas (S500) are repeated a plurality of times, the curing layer is formed on the surface of the thin film by the second gas, and then the step of supplying the first gas (S200) is performed again, any reaction between the first gas and elements other than impurities in the thin film (such as metal element, oxygen or nitrogen) can be suppressed or prevented, and defects due to loss or damage of the thin film can also be prevented.

For example, when the thin film is a metal oxide film, the impurity is carbon (C), and the first gas is hydrogen gas ($H_2$), the step of supplying the first gas (S200) is performed again with reduced amount of the impurity (i.e., carbon), and thus hydrogen atoms (H) of the first gas are also reacted with oxygen atoms (O) of the metal oxide film in addition to the impurities, so that oxygen atoms (O) may be detached from the thin film. As a result, oxygen (O) may be depleted in the metal oxide film, which deteriorates the quality and characteristics of the thin film. However, when the curing layer is formed on the surface of the thin film by the second gas containing oxygen atoms (O), it is possible for hydrogen atoms (H) of the first gas to react with oxygen atoms (O) of the curing layer. Also, oxygen atoms (O) detached from the thin film may be supplemented with oxygen atoms (O) of the curing layer. Therefore, the deficiency of oxygen (O) in the thin film can be prevented, and the quality and characteristics of the thin film can be improved.

Figure 4:
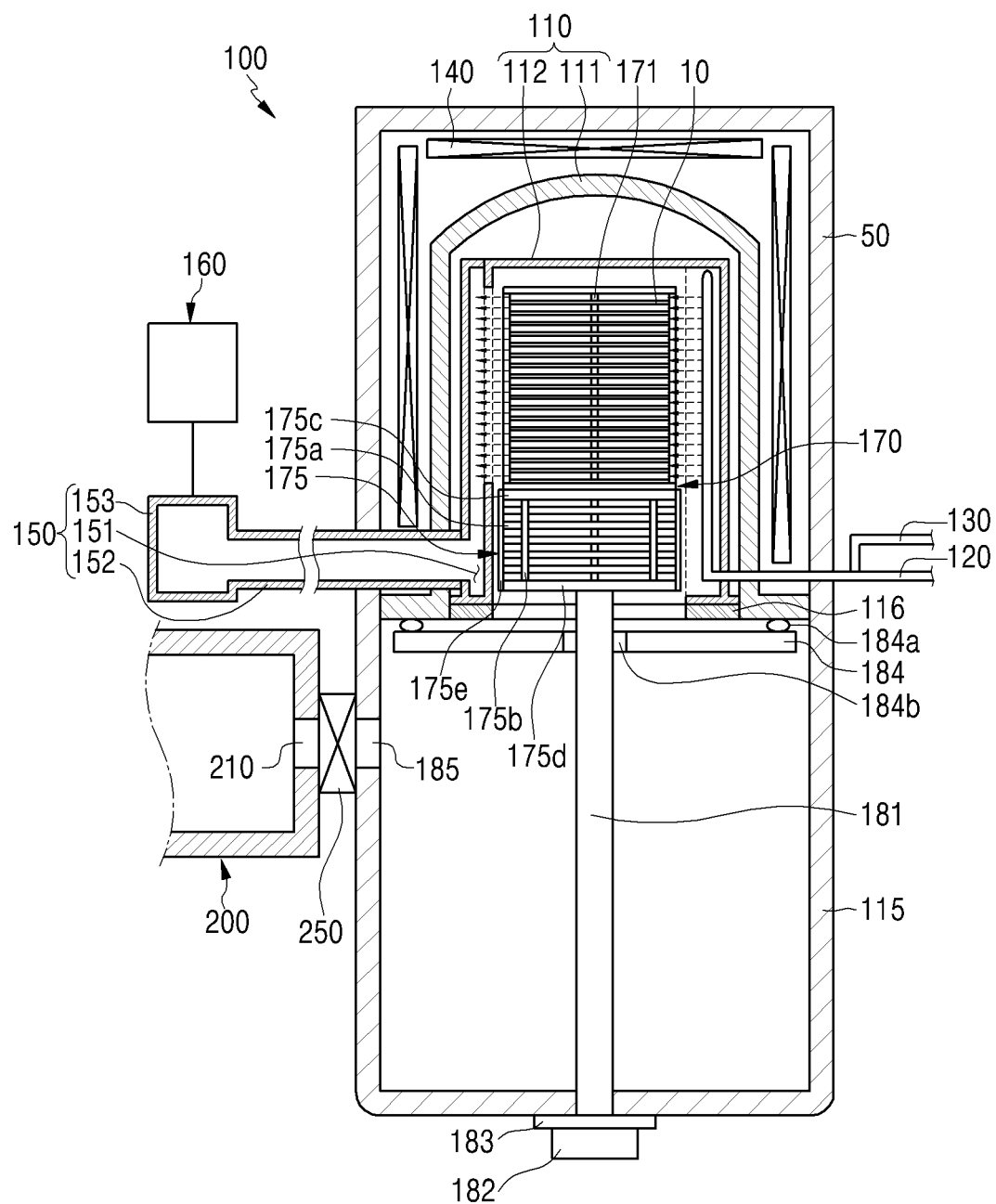
FIG. 4 is a schematic cross-sectional view illustrating a substrate processing apparatus according to another embodiment of the present inventive concept.

FIG. 4 is a schematic cross-sectional view illustrating a substrate processing apparatus according to another embodiment of the present inventive concept.

Hereinafter, a substrate processing apparatus according to another embodiment of the present inventive concept will be described in detail with reference to FIG. 4, but matters overlapping with those described above in relation to a method for removing impurities in a thin film according to an embodiment of the present inventive concept will be omitted.

According to another embodiment, a substrate processing apparatus 100 includes a process chamber 110 in which a substrate 10 having a thin film formed thereon is loaded and unloaded; a first gas supply unit 120 configured to supply a first gas into the process chamber 110, the first gas reacting and coupling with impurities contained in the thin film; a second gas supply unit 130 configured to supply a second gas into the process chamber 110, the second gas being different from the first gas; a heater unit 140 disposed outside the process chamber 110 to provide thermal energy to the interior of the process chamber 110; an exhaust unit 150 configured to exhaust the interior of the process chamber 110; and a control unit 160 configured to control the first gas supply unit 120, the second gas supply unit 130 and the exhaust unit 150, thereby supplying the first gas to produce a coupled product by a reaction of the impurities and the first gas and then exhaust the coupled product, and supplying the second gas to cure the thin film.

The substrate 10 having the thin film formed thereon may be loaded and unloaded in the process chamber 110. The process chamber 110 may be a single wafer type that processes the substrate one by one, or a batch type that simultaneously processes a plurality of substrates 10 by loading them in multiple layers on a substrate boat 170.

When the process chamber 110 is a batch type, the substrate processing apparatus 100 according to the present inventive concept may further include a substrate boat 170 on which the substrates 10 are loaded in multiple layers, and the process chamber 110 may have an interior space in which the substrate boat 170 is received.

The substrate boat 170 may have multi-layered slots formed in a plurality of rods 171 so that the substrates 10 can be inserted and loaded therein. Also, the substrate boat 170 may have multi-layered isolation plates (not shown) coupled to the plurality of rods 171. These isolation plates (not shown) may be disposed above or below the substrates 10 so that each substrate 10 can have an individual processing space. The substrate boat 170 may be rotated during the process. As a material for the substrate boat 170 such as the rod 171 and the isolation plate (not shown), ceramic, quartz, synthetic quartz, etc. may be used; the substrate boat is not limited thereto, but may take various structures, shapes, and materials.

The process chamber 110 may have an internal space (i.e., a process space) in which the substrate boat 170 is received, and may provide a space in which an impurity removal process is performed on the thin film formed on the substrate 10. For example, the process chamber 110 may be a process tube (or reaction tube) receiving the substrate boat 170, and a loading chamber 115 may be provided in communication with the process chamber 110 under the process chamber 110. The substrate 10 may be loaded on the substrate boat 170 in multiple layers from the loading chamber 115 by a transfer robot, etc. The process tube may have a single tube or a plurality of tubes as long as it can provide an internal space (process space) in which the substrate boat 170 can be received. The process tube may be composed of an outer tube 111 and an inner tube 112, and a flange part 116 may be coupled to a lower portion of the inner tube 112 to support it; the inner tube 112 is not limited thereto, but may take various structures and shapes.

In such batch type procedure using the substrate boat 170, a plurality of substrates 10 can be simultaneously processed, thereby increasing the throughput of substrates 10 per time.

The first gas supply unit 120 may supply a first gas that reacts and couples with impurities contained in the thin film inside the process chamber 110, and the first gas may react and couple with impurities contained in the thin film to produce a coupled product.

The second gas supply unit 130 may supply a second gas different from the first gas inside the process chamber 110, and the second gas may cure the thin film from which at least some of the impurities are removed.

The first gas supply unit 120 and the second gas supply unit 130 may be disposed on one side of the inner tube 112. The first gas supply unit 120 and the second gas supply unit 130 may respectively supply the first and second gases inside the process chamber 110 through a plurality of different injection nozzles. Otherwise, the first and second gases may be temporally separated and supplied through one injection nozzle. When one injection nozzle is used, a purge gas may be supplied to the injection nozzle through a purge gas supply unit (not shown). For example, the purge gas may be supplied to the injection nozzle between the supply of first gas and the supply of second gas, and the remaining gas of the first or second gas may be purged within the injection nozzle. The purge gas may include nitrogen gas ($N_2$) or any inert gas such as argon (Ar), helium (He), neon (Ne), or the like.

The heater unit 140 may be disposed outside the process chamber 110, and may provide thermal energy inside the process chamber 110. For example, the heater unit 140 may extend in a vertical direction on the outside of the inner tube 112 to heat the inner tube 112. The heater unit 140 may be disposed to surround the side and upper portions of the inner tube 112 or the outer tube 111, or may be provided on an inner wall of the outer cover 50 covering the outer tube 111. The heater unit 140 may adjust a temperature inside the process chamber 110. The temperature inside the process chamber 110 may be adjusted to a temperature of 100 to 400° C.

The exhaust unit 150 may evacuate the interior of the process chamber 110, adjust the internal pressure of the process chamber 110, and evacuate the coupled product between the first gas and the impurities and the remaining gas of the first and second gases. The exhaust unit 150 may be disposed on the other side of the inner tube 112 opposite to one side of the inner tube 112, and the coupled product and the remaining gases in the inner tube 112 may be exhausted (removed). Here, as the first gas supply unit 120 and the second gas supply unit 130 are positioned to face (or symmetrically to) the exhaust unit 150, a laminar flow may be formed on the substrate 10.

The control unit 160 may control the first gas supply unit, the second gas supply unit and the exhaust unit, thereby supplying the first gas to produce the coupled product by the reaction of the impurities and the first gas and then exhaust the coupled product, and supplying the second gas to cure the thin film. Also, the control unit 160 may control the first gas supply unit 120, the second gas supply unit 130 and the exhaust unit 150 to adjust the supply of the first and second gases and the internal pressure of the process chamber, so that the impurities can be removed from the thin film.

For example, the control unit 160 may control the first gas supply unit 120 to perform a first process in which the first gas is supplied and reacted with the impurities, and control the exhaust unit 150 to perform a second process in which the interior of the process chamber is depressurized to exhaust the coupled product between the impurities and the first gas. Also, the control unit 160 may control the second gas supply unit 130 to perform a third process in which the second gas is supplied to cure the thin film, and control the exhaust unit 150 to perform a fourth process in which the remaining second gas is exhausted from the interior of the process chamber 110. During the first process, the first gas is supplied and reacted with the impurities to produce the coupled product of the impurities and the first gas, and during the second process, the interior of the process chamber 110 is depressurized to exhaust the coupled product. Thus, the impurities can be effectively removed from the thin film.

During the third process, the second gas is supplied to cure the thin film, and during the fourth process, the remaining second gas is exhausted from the interior of the process chamber 110. Thus, the portions where the impurities have escaped from the thin film may be filled with the elements of the second gas to remove the defect, thereby improving the quality and reliability of the thin film.

The control unit 160 may supply the first gas under a first pressure of 0.1 to 20 torr inside the process chamber 110 (during the first process), and exhaust the coupled product by depressurizing the interior of the process chamber 110 under a second pressure of 0.1 to 20 mtorr, lower than the first pressure (during the second process).

the coupled product may be exhausted by rapidly reducing the internal pressure of the process chamber from the first pressure of 0.1 to 20 torr to the second pressure of 0.1 to 20 mtorr, and the impurities may be effectively removed from the surface of the thin film even deep in the trench.

For example, the exhaust unit 150 may include an exhaust port 151 provided at one side of the process chamber 110; an exhaust pipe 152 connected to the exhaust port 151; and a vacuum pump 153 connected to the exhaust pipe 152. The exhaust port 151 may be in communication with a lower portion of the exhaust duct, and thus an exhaust gas is introduced from the exhaust port 151 being in communication with the exhaust duct and transferred to the exhaust pipe 152 through the exhaust port 151 to be discharged to the outside.

The exhaust pipe 152 may be connected to the exhaust port 151 to provide an exhaust path between the exhaust port 151 and the vacuum pump 153.

The vacuum pump 153 may be connected to the exhaust pipe 152 to provide an exhaust pressure for discharging the exhaust gas (i.e., the coupled product and the remaining gas of the first and/or second gases) and evacuate the interior of the process chamber 110 in a vacuum state.

Here, the degree that an APC (auto pressure controller) valve (not shown) is opened and closed may be adjusted based on the pressure information detected by a pressure sensor (not shown) with the vacuum pump 153 operated, thereby adjusting the internal pressure of the process chamber 110.

The exhaust pipe 152 may have an inner diameter of 50 to 200 mm (or a size of 100 A or more) and a size of 200 A or more. Thus, the exhaust performance of the exhaust unit 150 may be improved, and the internal pressure of the process chamber 110 may be rapidly reduced from the first pressure of 0.1 to 20 torr to the second pressure of 0.1 to 20 mtorr. A maximum exhaust rate of the vacuum pump 153 may be 50 to 200 kl/s. In a general substrate processing apparatus using a vacuum pump having a maximum exhaust rate of less than 50 kl/s, the internal pressure of the process chamber 110 cannot be lowered to a pressure of 0.1 to 20 mtorr. However, by using the substrate processing apparatus 100 with the vacuum pump 153 having a maximum exhaust rate of 50 to 200 kl/s, according to the present inventive concept, the internal pressure of the process chamber 110 can be lowered to a pressure of 0.1 to 20 mtorr.

The impurities may include carbon, and the first gas may include hydrogen (H). When the thin film is deposited using a metal precursor compound such as an organometallic compound, the bonding between metal element and carbon ligand is not effectively broken, so that the metal element or oxides or nitrides of the metal element can be deposited with the bound some carbon atoms (C). As a result, carbon is contained in the thin film and act as an impurity, which may increase the resistivity and/or dielectric constant of the thin film. Accordingly, the impurity carbon must be removed from the thin film. The impurity (carbon) can be removed from the thin film by reacting carbon with the first gas containing hydrogen.

The thin film may include a metal element (M), and the second gas may include oxygen (O). As the thin film may include a metal element (M), when the impurity is coupled with the element of the first gas, the bond between metal element (M) and impurity is separated, and the metal element (M) will have a dangling bond (non-bonding site). Meanwhile, the second gas may include oxygen (O), and an oxygen atom (O) is bonded to the dangling bond of the metal element (M) to be adsorbed to the surface of the thin film to form the curing layer.

In addition, the control unit 160 may control the heater unit 140 to adjust a temperature inside the process chamber 110 to a temperature of 100 to 400° C. That is, the impurity removal process may be performed at a temperature of 100 to 400° C., and at least the interior of the process chamber 110 may be adjusted to a temperature of 100 to 400° C. by controlling the heater unit 140 (during the first process) to supply the first gas. The substrate processing apparatus 100 according to the present inventive concept can perform the impurity removal process even at a low temperature of 400° C. or less by large pressure difference and rapid depressurization, and thus a problem such as thermal load or thermal history may be solved. That is, the impurities may be effectively removed from the thin film even at a low temperature of 400° C. or less, and even in the case that the thin film has a trench with a large aspect ratio due to a pattern, the impurities may be effectively removed from the surface of the thin film even deep in the trench.

The control unit 160 may repeatedly perform the supply of first gas, the exhaust of coupled product and the supply of second gas a plurality of times. For example, the control unit 160 may repeatedly perform a plurality of times the first process, the second process, the third process, and the fourth process in this order. By repeating the supply of first gas, the exhaust of coupled product, and the supply of second gas, the efficiency of removing the impurities can be maximized, and the removal rate can be also maximized.

By repeating the supply of first gas and the exhaust of coupled product a plurality of times, the coupled product filled in the trench may be removed and the first gas may be introduced into the trench. As a result, the impurities can be better removed from the inner wall of the trench even deep in the trench, and they can be prevented from remaining on the inner wall of the trench.

According to the present inventive concept, the substrate processing apparatus 100 may further include a pedestal 175 connected to a lower end of the substrate boat 170 to support the substrate boat 170. The pedestal 175 is connected to the lower end of the substrate boat 170 to support the substrate boat 170. It may also ascend and descend together with the substrate boat 170, and may be housed in a space where the inner tube 112 is received during the process. The pedestal 175 may include a plurality of heat barrier plates 175a spaced apart from each other and arranged in multiple layers. The plurality of heat barrier plates 175a may be connected to a plurality of supports 175b, and they may be disposed in multiple layers and spaced apart from each other. The plurality of heat barrier plates 175a may comprise a baffle plate for preventing heat transfer in the vertical direction, and may be formed of a material (e.g., opaque quartz) having low heat transfer rate.

In addition, the pedestal 175 may further include the plurality of supports 175b which are extended in the vertical direction and spaced apart from each other; an upper plate 175c and a lower plate 175d to which the upper and lower ends of the plurality of supports 175b are fixed; and a side cover 175e surrounding the side (or the side of the pedestal) of the plurality of heat barrier plates 175a. The plurality of supports 175b may be extended in the vertical direction, and disposed to be spaced apart from each other in the horizontal direction. They may also support the plurality of heat barrier plates 175a.

The upper plate 175c may fix the upper end of the plurality of supports 175b and may be connected to the substrate boat 170. The lower plate 175d may fix the lower end of the plurality of supports 175b and may be connected to a shaft 181. The plurality of supports 175b, the upper plate 175c, and the lower plate 175d may form a skeleton (or frame) of the pedestal 175.

The side cover 175e may be formed to surround the side of the plurality of heat barrier plates 175a (or the side of the pedestal), and may be connected to the upper plate 175c and/or the lower plate 175d to fix them.

According to the present inventive concept, the substrate processing apparatus 100 may further include a shaft 181 connected to the lower plate 175d of the pedestal 175; a lift driving unit 182 connected to a lower end of the shaft 181 to move the shaft 181 up and down; a rotation driving unit 183 connected to the lower end of the shaft 181 to rotate the shaft 181; a support plate 184 connected to an upper end of the shaft 181 and configured to ascend and descend together with the substrate boat 170; a sealing member 184a provided between the inner tube 112 or the outer tube 111 and the support plate 184; a bearing member 184b provided between the support plate 184 and the shaft 181; and an insertion hole 185 through which the substrate 10 is loaded into a loading chamber 115.

The shaft 181 may be connected to the lower plate 175d of the pedestal 175 to support the pedestal 175 and/or the substrate boat 170.

The lift driving unit 182 may be connected to the lower end of the shaft 181 to move the shaft 181 up and down, thereby to ascending and descending the substrate boat 170.

The rotation driving unit 183 may be connected to the lower end of the shaft 181 to rotate the substrate boat 170. It may also rotate the shaft 181 and hence the substrate boat 170 about the shaft 181.

The support plate 184 may be connected to the upper end of the shaft 181 to ascend and descend together with the substrate boat 170. It may also function to seal the space receiving the inner tube 112 and/or the inner space of the outer tube 111 from the outside when the substrate boat 170 is housed in the space where the inner tube 112 is received.

The sealing member 184a may be provided between the support plate 184 and the inner tube 112 and/or between the support plate 184 and the outer tube 111 to seal the space receiving the inner tube 112 and/or the inner space of the outer tube 111.

The bearing member 184b may be provided between the support plate 184 and the shaft 181 to rotate the shaft 181 supported by the bearing member 184b.

The insertion hole 185 may be provided on one side of the loading chamber 115, and the substrate 10 may be loaded from the transfer chamber 200 through the insertion hole 185 into the loading chamber 115. An inlet port 210 may be formed on one side of the transfer chamber 200 corresponding to the insertion hole 185 of the loading chamber 115, and a gate valve 250 may be provided between the inlet port 210 and the insertion hole 185. Thus, the interior of the transfer chamber 200 may be separated from the interior of the loading chamber 115 by the gate valve 250, and the inlet port 210 and the insertion hole 185 may be opened and closed by the gate valve 250.

As described above, the present inventive concept can effectively remove impurities from a thin film by reacting impurities contained in the thin film with a first gas to produce a coupled product of the impurities and the first gas and rapidly depressurizing the interior of a process chamber to exhaust the coupled product, and consequently the thin film characteristics such as resistivity can be improved. Moreover, by exhausting a coupled product under rapid reduced pressure from a first pressure of 0.1~20 torr to a second pressure of 0.1~20 mtorr, when a thin film has a trench with a large (or deep) aspect ratio due to a pattern, it is possible to effectively remove impurities from a surface of the thin film even deep in the trench at a low temperature of 400° C. or less.

In addition, when a defect such as a vacancy is generated in a portion (or site) where an impurity has escaped from a thin film, a second gas different from the first gas may be supplied and the defect may be removed by the elements of the second gas to cure the thin film, thereby improving the reliability of the thin film.

Furthermore, by repeating a plurality of times the supply and exhaust of the first gas and the supply and exhaust of the second gas, the removal rate of impurities can be maximized.

Additionally, by forming a curing layer on a surface of the thin film by the second gas, the curing layer can suppress or prevent any reaction between the first gas with elements other than impurities in the thin film. Moreover, the curing layer formed on the thin film surface can prevent foreign substances from adhering to the thin film on a substrate unloaded from a process chamber, or the thin film from being oxidized.

As described above, although the preferred embodiments of the present inventive concept have been shown and described, the present inventive concept is not limited to the above-described embodiments, and it should be understood that various modifications and equivalents of the present inventive concept can be made by those skilled in the art to which the present inventive concept pertains without departing from the scope of the present inventive concept as set forth in the claims. Accordingly, the technical protection scope of the present inventive concept should be limited only by the following claims.

| The description of the numerical references | |
|---|---|
| 10: substrate | 50: outer cover |
| 100: substrate processing apparatus | 110: process chamber |
| 111: outer tube | 112: inner tube |
| 115: loading chamber | 116: flange part |
| 120: first gas supply unit | 130: second gas supply unit |
| 140: heater unit | 150: exhaust unit |
| 151: exhaust port | 152: exhaust pipe |
| 153: vacuum pump | 160: control unit |
| 170: substrate boat | 171: rod |
| 175: pedestal | 175a: heat barrier plate |
| 175b: support | 175c: upper plate |
| 175d: lower plate | 175e: side cover |
| 181: shaft | 182: lift driving unit |
| 183: rotation driving unit | 184: support plate |
| 184a: sealing member | 184b: bearing member |
| 185: insertion hole | 200: transfer chamber |
| 210: inlet port | 250: gate valve |

The invention claimed is:

1. A method for removing impurities in a thin film, the method comprising:
    providing a substrate having a thin film formed thereon in a process chamber, wherein the thin film has trench pattern;
    supplying a first gas reacting and coupling with impurities contained in the thin film, into the process chamber;
    exhausting a coupled product of the impurities and the first gas by stopping the supply of the first gas and depressurizing an interior of the process chamber, after supplying the first gas;
    curing the thin film by supplying a second gas being different from the first gas into the process chamber, after exhausting the coupled product; and
    stopping the supply of the second gas and exhausting the remaining second gas from the interior of the process chamber, after curing the thin film,
    wherein supplying the first gas is performed under a first pressure of 0.1 Torr to 20 Torr inside the process chamber for a first time period,
    wherein exhausting the coupled product is performed under a second pressure of 0.1 mTorr to 20 mTorr, lower than the first pressure for a second time period shorter than the first time period, by depressurizing the interior of the process chamber, and
    wherein curing the thin film is performed at a pressure higher than the second pressure.

2. The method of claim 1, wherein the impurities include carbon (C) and the first gas include hydrogen (H).

3. The method of claim 1, wherein the thin film includes a metal element and the second gas includes oxygen (O).

4. The method of claim 1, wherein supplying the first gas is performed at a temperature of 100 to 400° C.

5. The method of claim 1, wherein curing the thin film includes reacting the second gas with a surface of the thin film to form a curing layer.

6. The method of claim 5, wherein the curing layer has a thickness of 500 Å or less.

7. The method of claim 1, wherein the steps of supplying the first gas, exhausting the coupled product, curing the thin film, and exhausting the remaining second gas are repeated a plurality of times.

* * * * *